(12) United States Patent
Rysinski et al.

(10) Patent No.: US 7,622,990 B2
(45) Date of Patent: Nov. 24, 2009

(54) AMPLIFIERS, METHODS OF INCREASING CURRENT GAIN IN AMPLIFIERS, AND IMAGING DEVICES

(75) Inventors: Jeffrey Rysinski, Pasadena, CA (US); Sanjayan Vinayagamoorthy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 11/513,580

(22) Filed: Aug. 30, 2006

(65) Prior Publication Data

US 2008/0055004 A1   Mar. 6, 2008

(51) Int. Cl.
*H03F 3/45* (2006.01)

(52) U.S. Cl. .................. 330/253; 330/255; 330/257

(58) Field of Classification Search .......... 330/253, 330/255, 257, 261
See application file for complete search history.

(56) References Cited

U.S. PATENT DOCUMENTS

| | | | |
|---|---|---|---|
| 4,912,425 A * | 3/1990 | Kobayashi et al. ........ | 330/253 |
| 5,854,573 A | 12/1998 | Chan ........................ | 330/292 |
| 6,100,762 A * | 8/2000 | Kato ......................... | 330/255 |
| 6,605,993 B2 * | 8/2003 | Suzuki ...................... | 330/253 |
| 6,987,420 B2 * | 1/2006 | Miura ....................... | 330/255 |

OTHER PUBLICATIONS

Callewaert, Ludwig, et al. "Class AB CMOS Amplifiers with High Efficiency", *IEEE Journal of Solid State Circuits*, vol. 25, No. 3, pp. 684-691 (Jun. 1990).

* cited by examiner

*Primary Examiner*—Khanh V Nguyen
(74) *Attorney, Agent, or Firm*—Wells St. John, P.S.

(57) ABSTRACT

An amplifier includes a differential stage including a differential pair of transistors of a first conductivity type, the differential pair having gates, first and second inputs to the amplifier respectively including the gates of the differential pair; a current sum branch coupled to the differential stage, the current sum branch including a variable current source and being configured to sum current from the variable current source with current from the differential stage that flows to the current sum branch if a voltage at the first input exceeds a voltage at the second input; and an output stage coupled to the current sum branch. An imaging device and a method of manufacturing an amplifier are also provided.

57 Claims, 6 Drawing Sheets

AMPLIFIERS, METHODS OF INCREASING CURRENT GAIN IN AMPLIFIERS, AND IMAGING DEVICES

TECHNICAL FIELD

The technical field is amplifiers. More particularly, various embodiments of the invention relate to amplifier circuit designs, methods for manufacturing amplifiers, and imaging devices including amplifiers

BACKGROUND

A Class AB CMOS amplifier was introduced by Callewaert and Sansen in an article entitled "Class AB CMOS Amplifiers with High Efficiency" in the IEEE Journal of Solid State Circuits, Vol. 25 No. 3, 1990 (incorporated herein by reference). Their circuit is shown in its simplified schematic in FIG. 1.

In the original paper, the authors discussed that maximum current amplification during transition periods could easily exceed 25. However, much has changed since this prediction was made in 1990. Short channel effects coupled with a much lower power supply have restricted this ratio to a maximum of 15. Present implementations more typically have an actual current amplification of about 12.

The operation of the Callewaert and Sansen Class AB circuitry is described in detail in their article, but will be generally summarized here as well.

Figure 1:
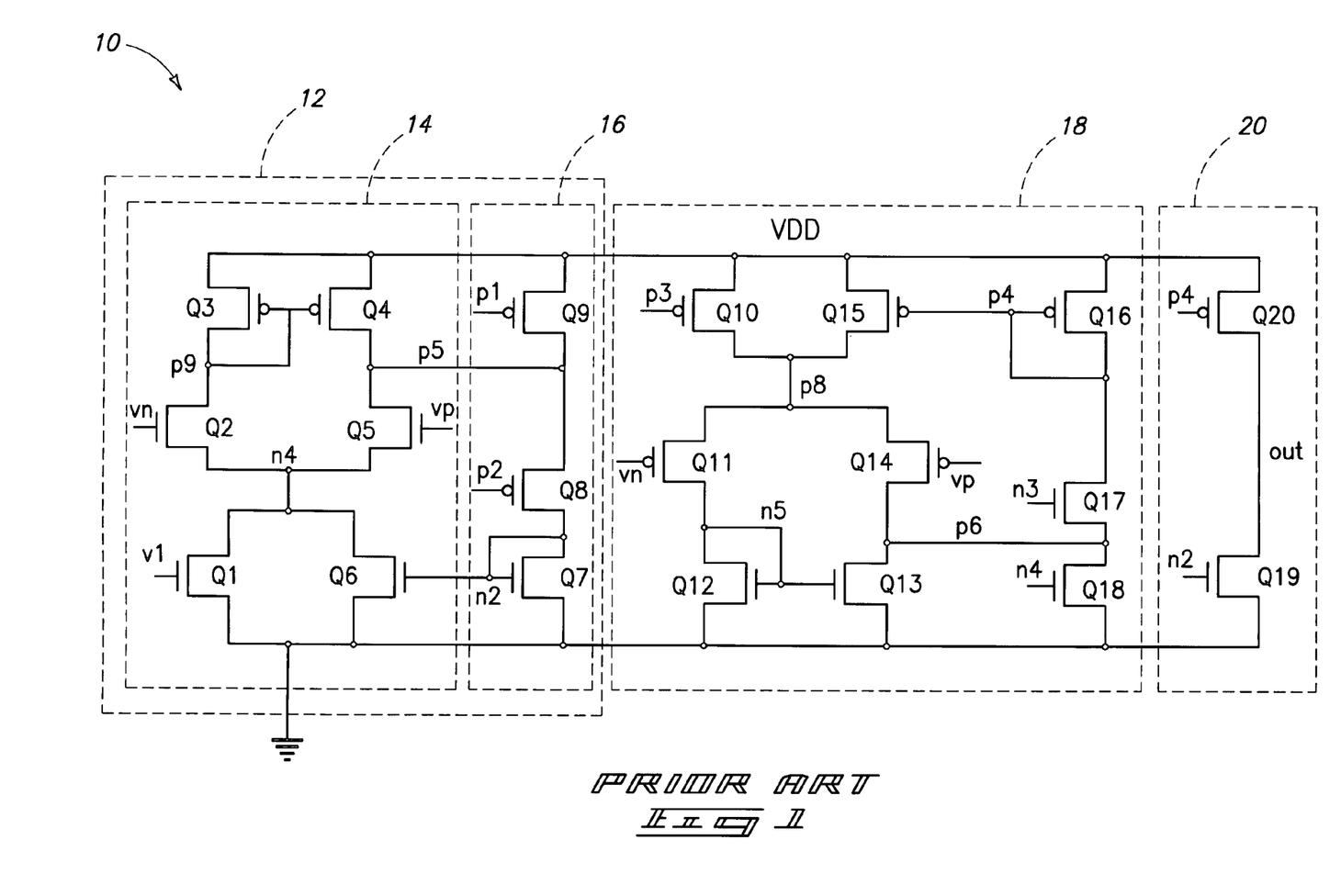
FIG. 1 is a circuit diagram of a prior art amplifier circuitry design.

FIG. 1 shows a Class AB amplifier 10 in accordance with the principles of Callewaert and Sansen. In FIG. 1, transistors Q1-Q9 define an input stage 12. Within the input stage 12, transistors Q1, Q2, Q3, Q4, Q5, and Q6 define a differential stage 14. The differential stage 14 includes a differential pair defined by transistors Q2 and Q5, having respective gates defining inputs vn and vp.

Transistors Q10, Q11, Q12, Q13, Q14, Q15, Q16, Q17, and Q18 define a complementary input stage 18 having PMOS transistors Q11 and Q14 as the inputs.

Transistors Q20 and Q19, connected to p4 and n2, define an output stage 20.

The general principle behind a Class AB amplifier is that in steady state, when no switching occurs, the amplifier consumes a relatively low operating current. But when a transition occurs, the Class AB amplifier requires some sort of mechanism to inject a current so that a load capacitance can be charged or discharged very quickly. After settling, and a return to steady state, the Class AB amplifier is again in a low current mode.

Figure 2:
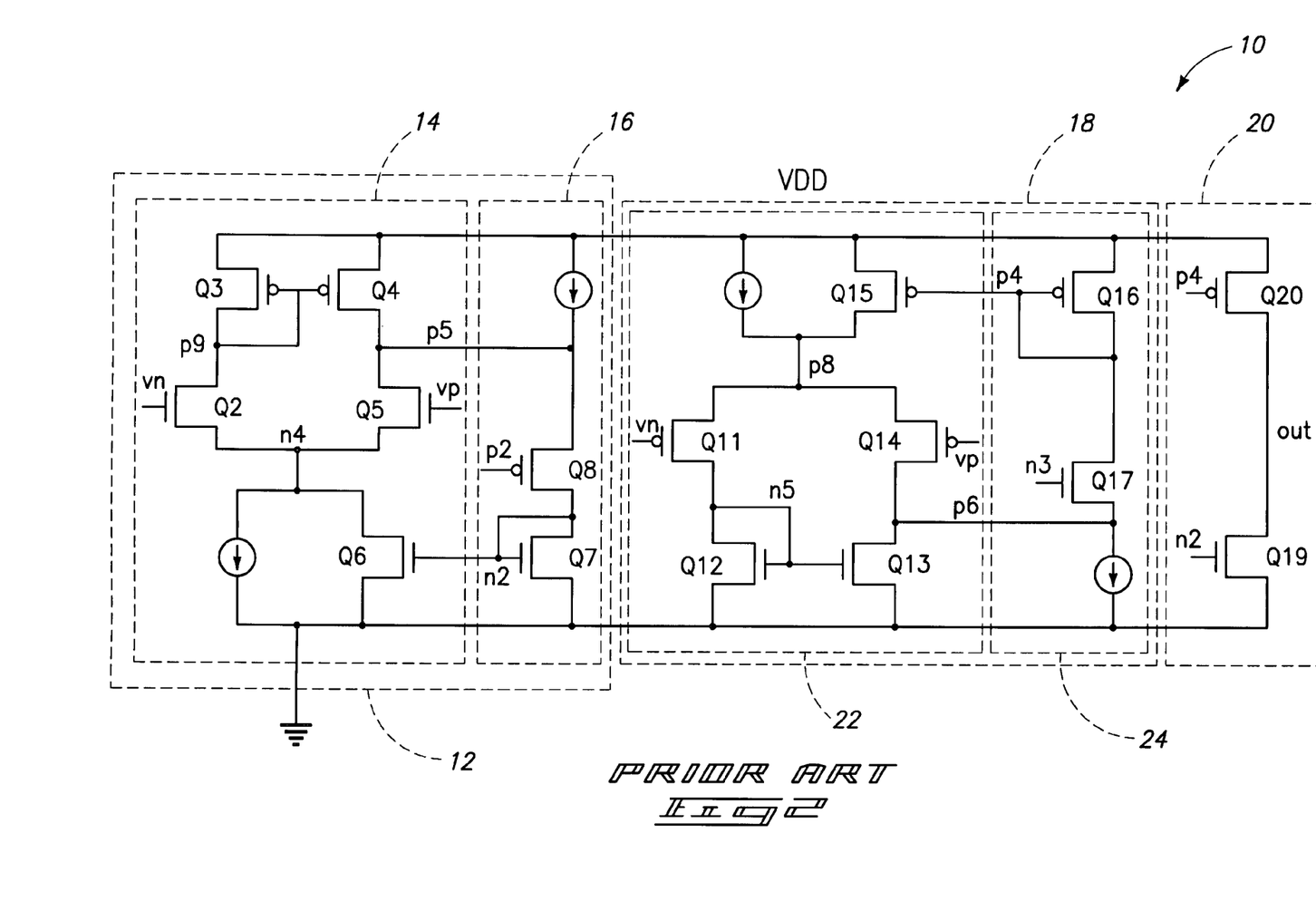
FIG. 2 is a simplified circuit diagram of the circuitry of FIG. 1.

In FIG. 1, transistor Q9 is connected as a current source, as p1 is coupled to a DC bias. Similarly, transistor Q18 is connected as a current source. FIG. 2 is a simplified circuit schematic showing these transistors as current sources. FIG. 2 is similar to FIG. 1, like reference numerals indicating like components.

Referring to FIG. 2, when input voltage vn is higher than input voltage vp, there is an increase in current through transistor Q2 and a decrease of current through transistor Q5. Transistor Q3 is connected as a diode.

The increase in current in transistor Q2 also goes through transistor Q3, which then gets mirrored to transistor Q4. Because the current of transistor Q5 is reduced, the excess current has to go somewhere, so it travels through path p5, and goes down through transistors Q8 and through Q7. Voltage at the gate p2 of transistor Q8 is set at some steady state bias reference voltage. The bias generator is not shown here, but it will provide a DC bias.

When the current through transistor Q7 increases, the voltage at node n2, the gate of transistor Q7, increases. Node n2 is also connected to the gate of output transistor Q19. Therefore, there is a sudden increase in current on the output transistor Q19 when the current through transistor Q7 increases.

As mentioned above, transistor Q9 (see FIG. 1) acts as a constant current source. Therefore, in steady state, all the current through transistor Q9 ideally goes through transistor Q7. The current through Q4 goes through Q5, and the current through Q3 goes through Q2.

Circuitry 18 is complementary to circuitry 12 and has a differential stage 22, and a current sum branch or stage 24. The differential stage 22 includes a differential pair of transistors Q11 and Q14 that are p-type transistors. When the input voltage vp goes above input voltage vn, there is an increase in current through transistor Q11, which increases the current through transistor Q12. Transistor Q12 is mirrored to transistor Q13, and that excess current goes through transistor Q16. Transistor Q16 is mirrored to transistor Q20, as the gate voltage p4 of transistor Q16 is coupled to the gate of transistor Q20. Transistor Q20 provides the output out when vp goes above vn. Thus, the operation of circuitry 18 is complementary to the operation of the circuitry 12.

In FIG. 2, the differential stage 22 including PMOS differential pair Q11 and Q14 controls an PMOS output Q20, affecting the value of the output "out" in FIG. 2, and the differential stage 14 including NMOS differential pair Q2 and Q5 controls an NMOS output Q19, affecting the value of the output "out." Each one of the differential stages 14 and 22 controls one of the output transistors Q20 and Q19.

BRIEF DESCRIPTION OF THE DRAWINGS

FIG. 3 is a circuit diagram of circuitry according to various embodiments of the present disclosure.

DETAILED DESCRIPTION OF THE ILLUSTRATED EMBODIMENTS

Various embodiments of the invention provide a method and apparatus for increased amplification in a Class AB amplifier. In some embodiments, current sinks/sources in the current sum branch or stage are variable. Amplifications of 25 or higher are achieved.

FIG. 3 shows circuitry 100 in accordance with various embodiments of the invention. The circuitry has some similarities with the circuitry of FIG. 2, with like reference numerals indicating like components.

The circuitry 100 includes an input stage 112. The input stage 112 includes a first differential stage 114, and a current sum stage 116. The circuitry 100 further includes an input stage 118, and an output stage 120. The input stage 118 includes a differential stage 122 and a current sum branch or stage 124.

An input stage 112 comprises transistors Q2-Q8 and current source 126 and CS2. Within the input stage 112, a differential stage 114 comprises transistors Q2, Q3, Q4, Q5, and Q6 and current source 126. The differential stage 114 includes a differential pair defined by transistors Q2 and Q5. The term "gate," as used herein, refers generically to the control electrode of the transistor and does not necessarily imply that a field effect transistor must be used.

More particularly, in differential stage 114, transistor Q3 is a diode-connected p type transistor having a source coupled to VDD, having a drain, and having a gate coupled to the source of transistor Q3 via path p9. The term VDD, as used herein, refers to a node that is coupled to a supply voltage when the circuitry 100 is in operation. Transistor Q4 is a p-type transistor having a source coupled to VDD, having a gate coupled to the gate of transistor Q3, and having a drain. Transistor Q2 is an n-type transistor having a drain coupled to the drain of transistor Q3 and to p9, having a gate (input vn), and having a source (node n4). Transistor Q5 is an n-type transistor having a drain coupled to the drain of transistor Q4 (and therefore to path p5). The differential stage 114 further includes a current source 126 which may comprise an n-type transistor having a drain coupled to node n4, having a source coupled to ground, and having a gate coupled to a bias voltage. The term ground, as used herein, refers to a node that is coupled to ground, or to a voltage lower than the voltage applied to node VDD which may possibly be a negative voltage. Transistor Q6 is an n-type transistor having a drain coupled to node n4, a gate coupled to node n2, and a source coupled to ground.

Figure 4:
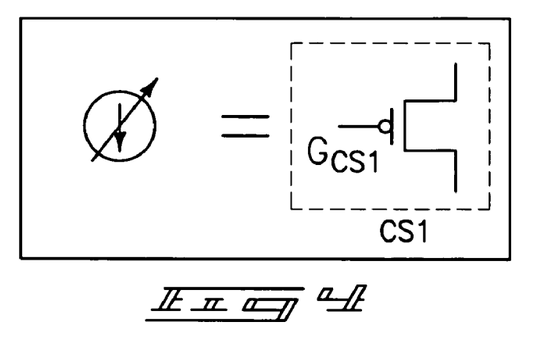
FIG. 4 illustrates one contemplated embodiment for one or more variable current sources shown in FIG. 3. Other embodiments are also contemplated.

Also within the input stage 112, a current sum branch or stage 116 comprises transistors Q7, Q8, and variable current source CS1. As shown in FIG. 4, variable current source CS1 may be implemented as a p-type transistor, in some embodiments, having a source coupled to VDD and having a drain. Transistor Q8 is a p-type transistor having a source coupled to the drain of variable current source CS1, having a gate coupled to p2, and having a drain. Transistor Q7 is a diode-connected n-type transistor having a drain coupled to the drain of transistor Q8, having a source coupled to ground, and having a gate coupled to the gate of transistor Q6 and to the drain of transistor Q7 and defining node n2.

Transistors Q11, Q12, Q13, Q14, Q15, Q16, and Q17, and current source 128 and CS2 define a complementary input stage 118 having the gates of PMOS transistors Q11 and Q14 as the inputs.

Input stage 118 includes a differential stage 122. More particularly, in differential stage 122, a constant current source 128 is coupled between VDD and path p8. The term "constant," as used herein, means substantially constant. The current source 128 may comprise a p-type transistor having a gate coupled to a bias voltage, a source coupled to VDD, and a drain coupled to p8. Transistor Q15 is a p-type transistor having a source coupled to VDD and having a drain coupled to p8. Transistor Q11 is a p-type transistor having a source coupled to p8, having a drain, and having a gate coupled to the input vn. Transistor Q14 is a p-type transistor having a source coupled to p8, having a drain, and having a gate coupled to the input vp. Transistor Q12 is a diode-connected n-type transistor having a drain coupled to the drain of transistor Q11 (node n5), having a source coupled to ground, and having a gate coupled to the drain of transistor Q12 and to n5. Transistor Q13 is an n-type transistor having a drain coupled to the drain of transistor Q14, having a source coupled to ground, and having a gate coupled to the gate of transistor Q12 and to node n5.

Input stage 118 also includes a current sum branch or stage 124. More particularly, in input stage 118, transistor Q16 is a p-type transistor having a source coupled to VDD, having a drain, and having a gate coupled to the drain of transistor Q16 and, via path p4, to the gate of transistor Q15. Transistor Q17 is an n-type transistor having a drain coupled to the drain of the transistor Q16, having a source, and having a gate coupled to a node n3. Variable current source CS2 may comprise an n-type transistor having a drain coupled to the source of transistor Q17 and having a source coupled to ground.

An output stage 120 comprises transistors Q20 and Q19, connected to p4 and n2. More particularly, transistor Q20 is a p-type transistor that has a source coupled to VDD, a drain coupled to an output node "out," and a gate coupled to p4; i.e., to the gates of transistors Q15 and Q16. Transistor Q19 is an n-type transistor that has a drain coupled to the drain of transistor Q20 and to the output node "out," a source coupled to ground, and a gate coupled to n2; i.e., to the gates of transistors Q6 and Q7.

The circuitry 100 defines a Class AB amplifier that, in steady state, when no switching occurs, consumes a relatively low operating current.

The circuitry shown in FIG. 3 provides increased current to the output stage 120. Referring to FIG. 1, considering the differential stage 14, transistor Q9 supplies a constant current to bias transistor Q7 in steady state conditions. However, circuitry 100 of FIG. 3 is arranged so that $G_{CS1}$ provides that constant current and, during transition, $G_{CS1}$ increases in current as well as an increase in output current from the input stage. The circuitry 100 provides two sources of increased current so even more current can be provided to the output stage.

Variable current source CS1 is a dynamic current source. In steady state it operates the same way as the constant current source in the current sum branch 16 of FIG. 2. However, during transitions, CS1 is adjusted for increased current, and that extra current goes through Q7, and is mirrored directly to the output, via node n2 which is coupled to the gate of transistor Q19.

Similarly, CS2 is a dynamic current source. In steady state it operates the same way as the constant current source in the current sum branch 24 of FIG. 2. However, during transitions, CS2 is adjusted for increased current, and the extra current decreases the voltage at p4 on the gate of transistor Q16 and that is mirrored directly to the output, via p4 which is coupled to the gate of transistor Q20.

Figure 5:
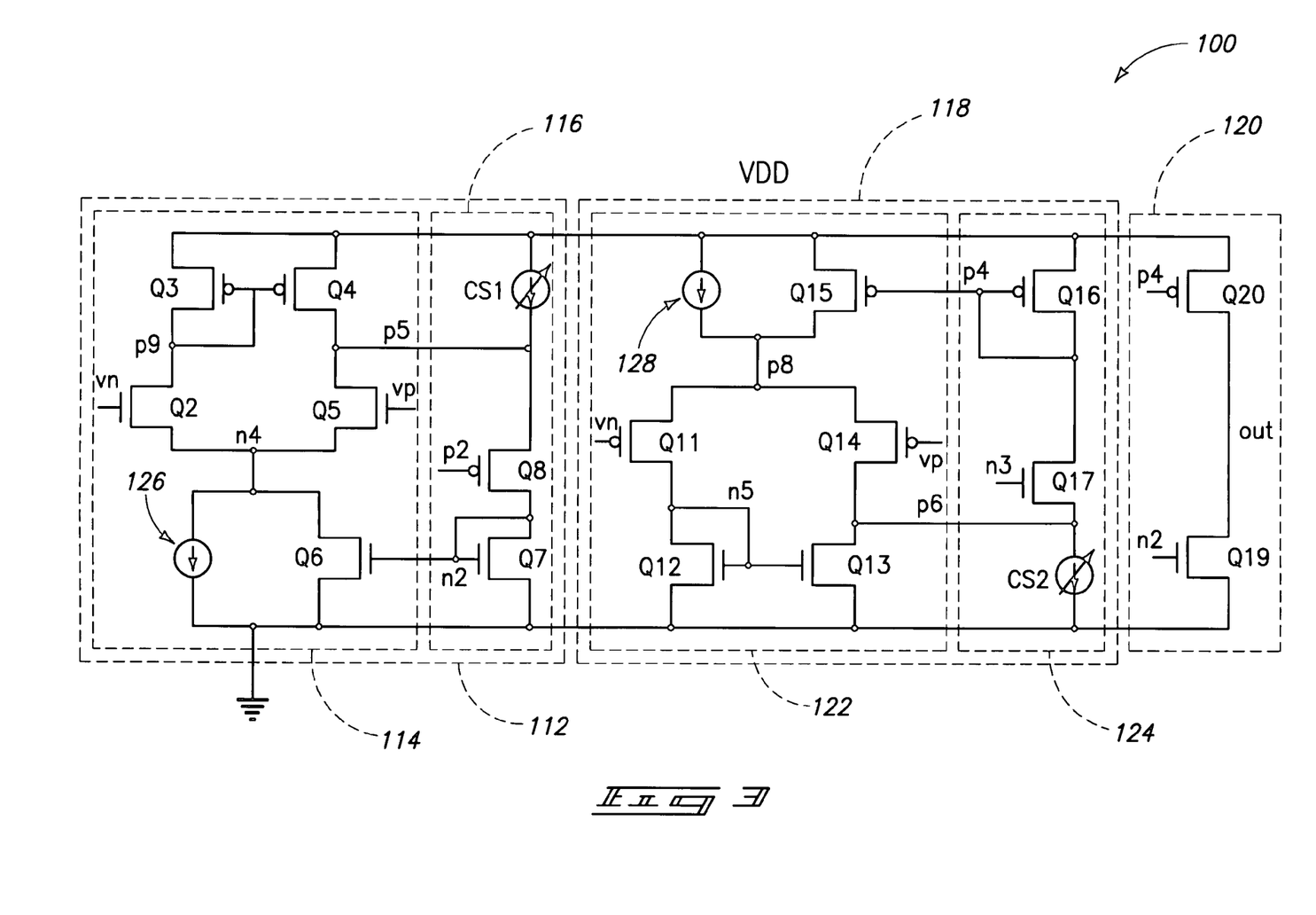
FIG. 5 is a circuit diagram illustrating one contemplated embodiment for controlling one or more variable current sources shown in FIG. 3. Other embodiments are also contemplated.

FIG. 5 illustrates one contemplated embodiment for a variable current source CS1. Other variable current source designs can be employed and FIG. 5 is being provided as an example only. FIG. 5 shows one example of gain control circuitry 126 that controls the variable current source CS1 in FIG. 3. The gain control circuitry 126 includes a p-type transistor Q21 having a source coupled to VDD, having a drain, and having a gate coupled to the node p9 in FIG. 3. The circuitry 126 further includes an n-type diode-connected transistor Q22 having a drain coupled to the drain of transistor Q21, having a source coupled to ground, and having a gate coupled to the drain of transistor Q22. The circuitry 126 further includes a p-type transistor Q24 having a source coupled to VDD, having a drain defining a node $G_{CS1}$, and having a gate coupled to the drain of transistor Q24. The circuitry 126 further includes an n-type transistor Q23 having a drain coupled to the drain of transistor Q24, having a source coupled to ground, and having a gate coupled to the gate of transistor Q22. The circuitry 126 further includes an n-type transistor nb1 having a drain coupled to the drain of transistor Q23, having a source coupled to ground, and having a gate. An offset control input comprises the gate of the n-type transistor nb1.

Referring to FIG. 3, during a transition, as described above, when vn goes higher than vp, there is a lot more current through Q2 and Q3. When there is an increase in current through Q2 and Q3, voltage at p9 goes down. Referring now to FIG. 5, voltage at node p9 is going to go down, which means there is going to be more current through transistor Q21, and then transistor Q22 will also have to take that current so current through Q22 increases and that is mirrored to Q23. A multiplication can also take place. In some embodiments, a wider transistor could be employed for transistors Q23 than transistor Q22. The extra current that gets mirrored to transistor Q23 causes the voltage on node $G_{CS1}$ to go lower. $G_{CS1}$ is connected to the gate of the transistor CS1 in FIG. 3.

Referring to FIGS. 3 and 5, $G_{CS1}$, the voltage at the drain of transistor Q23, is connected to the gate of the p-type transistor Q24. Instead of just constant current, there is an increase in current which then goes down to the diode connected transistor Q7 and is mirrored to the output via node n2.

Transistor nb1 in FIG. 5 is at constant current. This transistor can be used to adjust the DC reference level. It can be used to adjust the DC current that is going to go through the current source CS1 in FIG. 3. The inventors found that it was difficult to have the current mirror loop generate that reference current, so an offset control was provided. FIG. 5 is but one specific implementation. Any other circuit to generate the desired increase in current in the current sum branch 116 may be employed in place of the circuitry of FIG. 5. With this simple circuit one not only has current amplification control on CS1 and CS2 but offset control as well; i.e. for the nominal current flow through the current sum branch.

Figure 6:
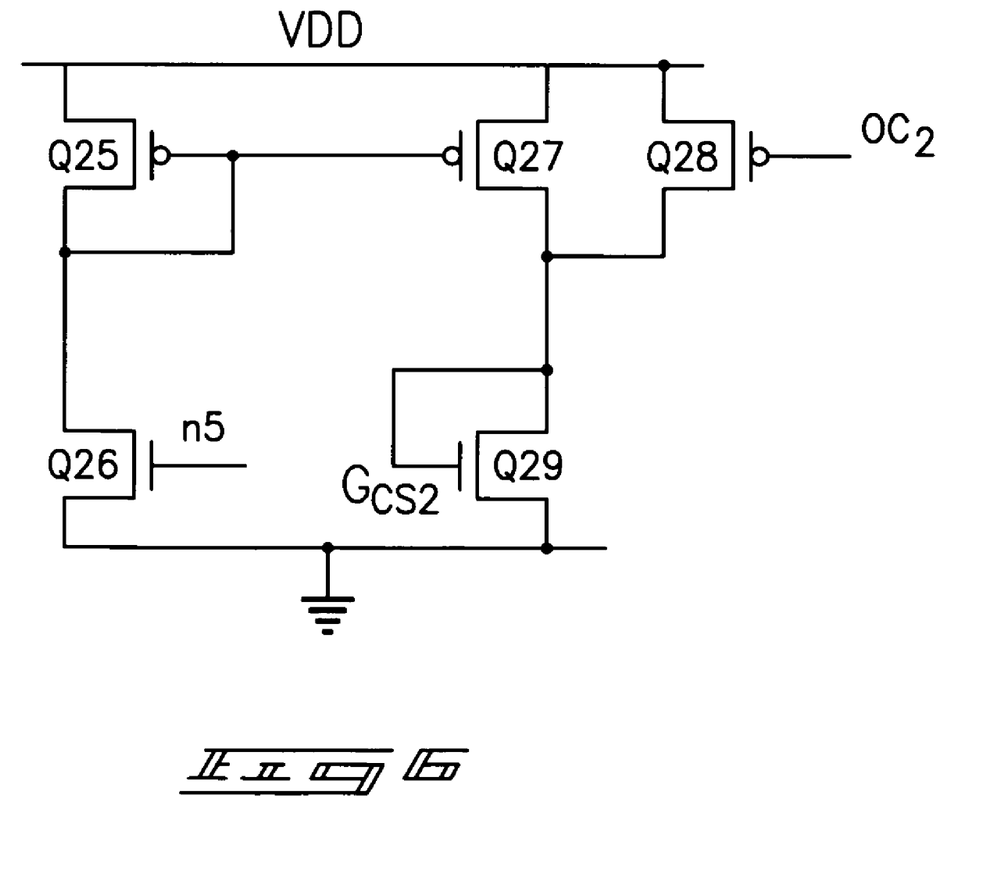
FIG. 6 is a circuit diagram illustrating one contemplated embodiment for controlling one or more variable current sources shown in FIG. 3. Other embodiments are also contemplated.

For the PMOS input stage 118, a complementary circuit is provided, as shown in FIG. 6. The circuitry of FIG. 6 includes a p-type transistor Q25 having a source coupled to VDD, having a drain, and having a gate coupled to the drain of transistor Q25. Transistor Q26 is an n-type transistor having a drain coupled to the drain of transistor Q25, having a source coupled to ground, and having a gate coupled to node n5. Transistor Q27 is a p-type transistor having a source coupled to VDD, having a drain, and having a gate coupled to the gate of transistor Q25. Transistor Q28 is a p-type transistor having a source coupled to VDD, having a drain, and having a gate defining an offset control input $OC_2$. Transistor Q29 is an n type transistor having a drain coupled to the drain of transistor Q27, having a source coupled to ground, and having a gate coupled to the drain of transistor Q29.

Figure 7:
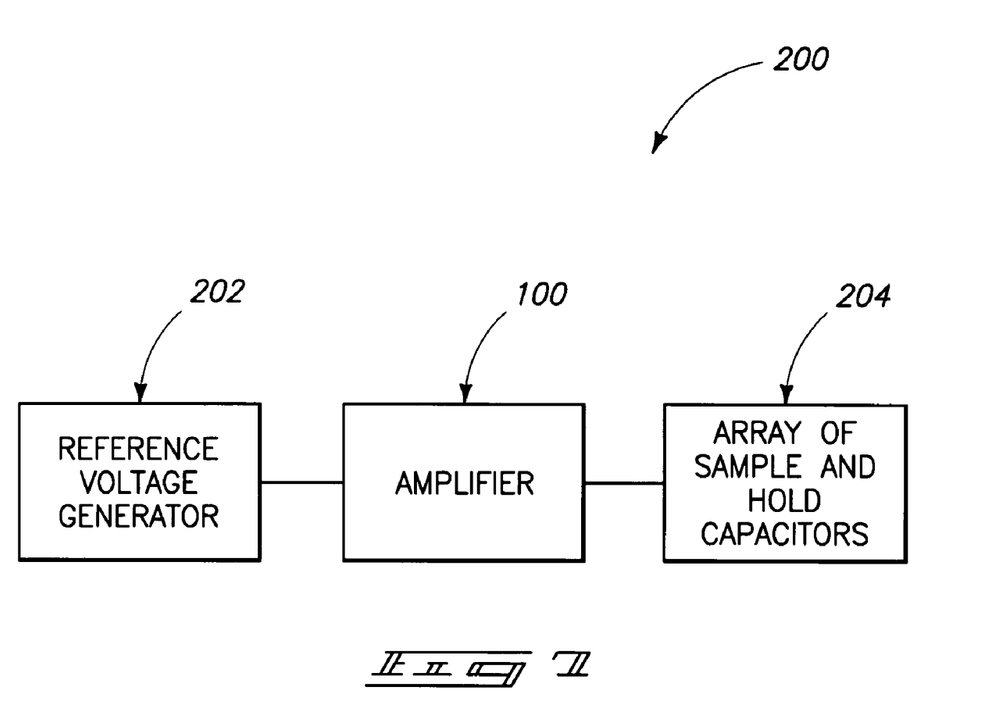
FIG. 7 is a block diagram illustrating one contemplated application for the circuitry shown in FIG. 3. Other applications are possible.

FIG. 7 shows but one contemplated application for the circuitry of FIG. 3. This is one example only, and the circuitry of FIG. 3 may be employed anywhere that the amplifier of the type discussed in Callewaert and Sansen is employed. FIG. 7 shows an imaging apparatus 200 used in semiconductor processing lithography comprising a reference voltage generator 202, amplifier 100 having inputs coupled to the reference voltage generator 202, and an array 204 of sample and hold capacitors coupled to the output of the amplifier 100. Each column of a pixel array typically has two sample and hold capacitors. The amplifier 100 is used to drive a reference voltage for one plate of an array of these capacitors.

The circuitry provided herein addresses the problems described above in the Background of the Invention section. Current amplification of greater than 25 can be achieved with the circuitry as provided herein.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An amplifier comprising:
   a differential stage including a differential pair of transistors of a first conductivity type, the differential pair having gates, first and second inputs to the amplifier respectively including the gates of the differential pair;
   a current sum branch coupled to the differential stage, the current sum branch including a variable current source and being configured to sum current from the variable current source with current from the differential stage that flows to the current sum branch if a voltage at the first input exceeds a voltage at the second input; and
   an output stage coupled to the current sum branch.

2. An amplifier in accordance with claim 1 wherein the output stage includes a transistor of the first conductivity type having a gate coupled to a voltage defined in the current sum branch.

3. An amplifier in accordance with claim 1 and further comprising a second differential stage including a differential pair of transistors of a second conductivity type, opposite the first conductivity type, the second differential pair having gates respectively coupled to the first and second inputs, and a second current sum branch coupled to the second differential stage, the second current sum branch including a second variable current source and being configured to sum current from the second variable current source with current from the second differential stage that flows to the current sum branch if the voltage at the second input exceeds the voltage at the first input.

4. An amplifier in accordance with claim 3 wherein the output stage includes a transistor of the second conductivity type having a gate coupled to a voltage defined in the second current sum branch.

5. An amplifier in accordance with claim 1 wherein the differential pair of transistors are n-type transistors.

6. An amplifier in accordance with claim 5 wherein the differential pair of transistors comprise p-type transistors.

7. An amplifier in accordance with claim 1 wherein the differential pair of transistors comprise field effect transistors.

8. An amplifier in accordance with claim 1 wherein the amplifier is a CMOS amplifier.

9. An amplifier in accordance with claim 1 wherein the amplifier is a Class AB amplifier.

10. An amplifier in accordance with claim 1 wherein the variable current source comprises a transistor.

11. An amplifier in accordance with claim 1 wherein the variable current source comprises a transistor of a second conductivity type opposite the first conductivity type.

12. An amplifier in accordance with claim 1 wherein the differential stage and the variable current source are individually configured to control provision of increased current to the output stage during a transition where the voltage at the first input exceeds the voltage at the second input compared with current provided to the output stage during steady state operation of the amplifier.

13. An amplifier in accordance with claim 1 wherein the current sum branch is configured to mirror a summed current to the output stage which results from the summation of the current from the variable current source and the current from the differential stage, and wherein the summed current is greater during a transition where the voltage at the first input exceeds the voltage at the second input compared with current mirrored from the current sum branch to the output stage during steady state operation of the amplifier.

14. An amplifier in accordance with claim 1 wherein the current sum branch is configured to mirror a summed current to the output stage which results from the summation of the current from the variable current source and the current from the differential stage, and wherein the summed current is varied responsive to an application of different voltages to the first and second inputs.

15. An amplifier in accordance with claim 1 wherein the current sum branch comprises a transistor which comprises a plurality of power electrodes which are configured to conduct the current from the differential stage.

16. A method of manufacturing an amplifier, the method comprising:
    forming a differential stage using a differential pair of transistors of a first conductivity type, the transistors of the differential pair having respective control electrodes, first and second inputs to the amplifier respectively including the control electrodes of the differential pair;
    coupling a current sum stage to the differential stage, using a variable current source in the current sum stage, and arranging the current sum stage to sum current from the variable current source with current from the differential stage that flows to the current sum stage if a voltage at the first input exceeds a voltage at the second input; and
    coupling an output stage to the current sum stage.

17. A method in accordance with claim 16 and comprising including in the output stage a transistor of the first conductivity type having a gate coupled to a voltage defined in the current sum stage.

18. A method in accordance with claim 16 and further comprising forming a second differential stage from a differential pair of transistors of a second conductivity type, opposite the first conductivity type, the second differential pair having gates respectively coupled to the first and second inputs, and coupling a second current sum stage to the second differential stage, the second current sum stage including a second variable current source and being configured to sum current from the second variable current source with current from the second differential stage that flows to the current sum branch if the voltage at the second input exceeds the voltage at the first input.

19. A method in accordance with claim 18 and comprising including in the output stage a transistor of the second conductivity type having a gate coupled to a voltage defined in the second current sum stage.

20. A method in accordance with claim 16 and further comprising using n-type transistors in the differential pair.

21. A method in accordance with claim 20 and further comprising using p-type transistors in the differential pair.

22. A method in accordance with claim 16 and further comprising using field effect transistors in the differential pair.

23. A method in accordance with claim 16 and comprising using CMOS processing techniques to form the amplifier.

24. A method in accordance with claim 16 and further comprising manufacturing a Class AB amplifier.

25. A method in accordance with claim 16 and comprising defining the variable current source using a transistor.

26. A method in accordance with claim 16 and further comprising using a transistor of a second conductivity type, opposite the first conductivity type, for the variable current source.

27. A method in accordance with claim 16 wherein the differential stage and the variable current source control provision of increased current to the output stage during a transition where the voltage at the first input exceeds the voltage at the second input compared with current provided to the output stage during steady state operation of the amplifier.

28. A method in accordance with claim 16 wherein the current sum branch mirrors a summed current to the output stage which results from the summation of the current from the variable current source and the current from the differential stage, and wherein the summed current is greater during a transition where the voltage at the first input exceeds the voltage at the second input compared with current mirrored from the current sum branch to the output stage during steady state operation of the amplifier.

29. A method in accordance with claim 16 wherein the arranging comprises arranging the current sum branch to mirror a summed current to the output stage which results from the summation of the current from the variable current source and the current from the differential stage, and wherein the summed current is varied responsive to an application of different voltages to the first and second inputs.

30. A method in accordance with claim 16 wherein the arranging comprises arranging a transistor of the current sum branch to conduct the summed current including the current which is received from the differential stage and the current from the variable current source via a plurality of power electrodes of the transistor.

31. An amplifier comprising:
    a differential stage including a differential pair of transistors of a first conductivity type, the differential pair having gates, the amplifier having first and second inputs respectively including the gates of the differential pair;
    a current sum branch coupled to the differential stage, the current sum branch including a variable current source and being configured to sum current from the variable current source with current from the differential stage that flows to the current sum branch if a voltage at the first input exceeds a voltage at the second input;
    an output stage coupled to the current sum branch; and
    gain control circuitry configured to increase current through the variable current source if a voltage at the first input exceeds a voltage at the second input.

32. An amplifier in accordance with claim 31 wherein the variable current source comprises a transistor.

33. An amplifier in accordance with claim 31 wherein the gain control circuitry includes a gain control input transistor arranged to provide increased current if the voltage at a node in the differential pair decreases, and includes a node having a voltage that decreases in response to current increasing in the gain control input transistor.

34. An amplifier in accordance with claim 31 wherein the variable current source comprises a transistor of a second conductivity type, opposite the first conductivity type, and having a gate, wherein the gain control circuitry includes a gain control input transistor arranged to provide increased current if the voltage at a node in the differential pair decreases, and includes a node having a voltage that decreases in response to current increasing in the gain control input transistor, which node is coupled to the gate of the transistor defining the variable current source.

35. An amplifier in accordance with claim 34 and further comprising a second differential stage including a differential pair of transistors of the second conductivity type, the second differential pair having gates respectively coupled to the first and second inputs, and a second current sum branch coupled to the second differential stage, the second current sum branch including a second variable current source and being configured to sum current from the second variable current source with current from the second differential stage that flows to the current sum branch if the voltage at the second input exceeds the voltage at the first input.

36. An amplifier in accordance with claim 35 wherein the output stage includes a transistor of the second conductivity type having a gate coupled to a voltage defined in the second current sum branch.

37. An amplifier in accordance with claim 36 wherein the output stage includes a transistor of the second conductivity type having a gate coupled to a voltage defined in the second current sum branch.

38. An amplifier in accordance with claim 31 wherein the differential pair of transistors comprises p-type transistors.

39. An amplifier in accordance with claim 31 wherein the differential pair of transistors are field effect transistors.

40. An amplifier in accordance with claim 31 wherein the gain control circuitry provides offset control for adjusting nominal current flow through the variable current source at times other than when the voltage at the second input exceeds the voltage at the first input.

41. A method of manufacturing an amplifier, the method comprising:
   including in a differential stage a differential pair of transistors of a first conductivity type, the differential pair having gates, first and second inputs to the amplifier respectively including the gates of the differential pair;
   coupling a current sum branch to the differential stage, the current sum branch including a variable current source and being configured to sum current from the variable current source with current from the differential stage that flows to the current sum branch if a voltage at the first input exceeds a voltage at the second input;
   coupling an output stage to the current sum branch; and
   increasing current through the variable current source, using gain control circuitry, if a voltage at the first input exceeds a voltage at the second input.

42. A method in accordance with claim 41 and comprising providing the variable current source with a transistor.

43. A method in accordance with claim 41 wherein increasing current using the gain control circuitry comprises arranging a gain control input transistor to provide increased current if the voltage at a node in the differential pair decreases, and comprises providing a node having a voltage that decreases in response to current increasing in the gain control input transistor.

44. A method in accordance with claim 42 and comprising providing the variable current source with a transistor, wherein increasing current using the gain control circuitry comprises arranging a gain control input transistor to provide increased current if the voltage at a node in the differential pair decreases, and comprises providing a node having a voltage that decreases in response to current increasing in the gain control input transistor, which node is coupled to the gate of the transistor providing the variable current source.

45. A method in accordance with claim 44 and further comprising providing a second differential stage including a differential pair of transistors of the second conductivity type, the second differential pair having gates respectively coupled to the first and second inputs, and a second current sum branch coupled to the second differential stage, the second current sum branch including a second variable current source and being configured to sum current from the second variable current source with current from the second differential stage that flows to the current sum branch if the voltage at the second input exceeds the voltage at the first input.

46. A method in accordance with claim 45 and comprising including in the output stage a transistor of the second conductivity type having a gate coupled to a voltage defined in the second current sum branch.

47. A method in accordance with claim 46 and comprising including in the output stage a transistor of the first conductivity type having a gate coupled to a voltage defined in the first current sum branch.

48. A method in accordance with claim 41 and comprising using p-type transistors for the differential pair of transistors.

49. A method in accordance with claim 41 and comprising using field effect transistors for the differential pair of transistors.

50. A method in accordance with claim 41 and comprising using the gain control circuitry to adjust nominal current flow through the variable current source at times other than when the voltage at the second input exceeds the voltage at the first input.

51. An imaging device, the imaging device comprising:
   a reference voltage generator;
   a plurality of sample and hold capacitors; and
   a Class AB CMOS operational amplifier having an input coupled to the reference voltage generator and an output coupled to the plurality of sample and hold capacitors, the amplifier including:
      a differential stage including a differential pair of transistors of a first conductivity type, the differential pair having gates respectively defining first and second inputs to the amplifier;
      a current sum branch coupled to the differential stage, the current sum branch including a variable current source and being configured to sum current from the variable current source with current from the differential stage that flows to the current sum branch if a voltage at the first input exceeds a voltage at the second input;
      an output stage coupled to the current sum branch; and
      gain control circuitry configured to increase current through the variable current source if a voltage at the first input exceeds a voltage at the second input.

52. An imaging device in accordance with claim 51 and further comprising a second differential stage including a differential pair of transistors of a second conductivity type, opposite the first conductivity type, the second differential pair having gates respectively coupled to the first and second inputs, and a second current sum branch coupled to the second differential stage, the second current sum branch including a second variable current source and being configured to sum current from the second variable current source with current from the second differential stage that flows to the current sum branch if the voltage at the second input exceeds the voltage at the first input.

53. An imaging device in accordance with claim 52 wherein the output stage includes a transistor of the first conductivity type having a gate coupled to a voltage defined in the first current sum branch in series with a transistor of the second conductivity type having a gate coupled to a voltage defined in the second current sum branch.

54. An imaging device in accordance with claim 53 wherein the first mentioned differential pair of transistors are n-type transistors and wherein the second mentioned differential pair of transistors comprise p-type transistors.

55. An imaging device in accordance with claim 53 wherein all transistors of the amplifier are field effect transistors.

56. An imaging device in accordance with claim 53 wherein the respective variable current sources comprise a transistor.

57. An imaging device in accordance with claim 53 wherein the first mentioned variable current source includes a transistor of the second conductivity type and wherein the second mentioned variable current source includes a transistor of the first conductivity type.

* * * * *

UNITED STATES PATENT AND TRADEMARK OFFICE
CERTIFICATE OF CORRECTION

PATENT NO. : 7,622,990 B2
APPLICATION NO. : 11/513580
DATED : November 24, 2009
INVENTOR(S) : Rysinski et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 161 days.

Signed and Sealed this

Twenty-sixth Day of October, 2010

David J. Kappos
*Director of the United States Patent and Trademark Office*